United States Patent [19]

Leone et al.

[11] Patent Number: 5,397,895
[45] Date of Patent: Mar. 14, 1995

[54] PHOTOIONIZATION MASS SPECTROSCOPY FLUX MONITOR

[75] Inventors: Stephen R. Leone; Struppp Paul G., both of Boulder, Colo.; Russell V. Smilgys, Fairfax, Va.; April L. Alstrin, Boulder, Colo.

[73] Assignee: The United States of America as represented by the Secretary of Commerce, Washington, D.C.

[21] Appl. No.: 19,854

[22] Filed: Feb. 19, 1993

Related U.S. Application Data

[63] Continuation-in-part of Ser. No. 950,602, Sep. 24, 1992, abandoned.

[51] Int. Cl.$^6$ .................. B01D 59/44; H01J 49/00
[52] U.S. Cl. ............................ 250/288; 250/282; 250/423 P
[58] Field of Search ............ 250/307, 310, 282, 288, 250/423 P

[56] References Cited

U.S. PATENT DOCUMENTS

| | | | |
|---|---|---|---|
| 4,442,354 | 4/1984 | Hurst et al. | 250/288 |
| 4,633,084 | 12/1986 | Gruen et al. | 250/423 P |
| 4,733,073 | 3/1988 | Becker et al. | 250/288 |
| 4,920,264 | 4/1990 | Becker | 250/282 |
| 5,093,573 | 3/1992 | Mikoshiba et al. | 250/307 |
| 5,096,533 | 3/1992 | Igarash | 250/252.1 |
| 5,105,082 | 4/1992 | Maruo et al. | 250/287 |
| 5,148,025 | 9/1992 | Ahn et al. | 250/307 |

OTHER PUBLICATIONS

C. H. Becker and K. T. Gillen, "Surface analysis of contaminated GaAs: Comparison of new laser-based techniques with SIMS", *J. Vac. SciTechnol* A3:1347 (1985).

Joan B. Pallix, Udo Schuhle, Christopher H. Becker, and David L. Luestis, "Advantages of Single-Photon Ionization over Multiphoton Ionization for Mass Spectrometric Surface Analysis of Bulk Organic Polymers", *Anal. Chem,* vol. 61, No. 8, Apr. 15, 1989, pp 805-811.

J. Y. Tsao, T. M. Brennan, J. F. Flem, and B. E. Hammons, "On-line determination of alloy composition during ternary III/V molecular beam epitaxy", *Appl. Phys. Lett.* 55(8), 21 Aug. 1989, pp. 777-779.

Ring-Ling Chien and Michael R. Sogard, "Monitoring the beam flux in molecular beam epitaxy using laser multiphoton ionization", *J. Vac. Sci. Technol.* A 8(3), May/Jun. 1990, pp. 1597-1602.

Russell V. Smilgys, Ph. D. Thesis, University of Colorado, "Laser probing of molecular beam epitaxy in silicon (100) surface," (1990).

C. H. Becker, "On the use of single-photon ionization for inorganic surface analysis", *Fresenius J. Anal. Chem.* 341:3-6 (1991).

R. J. J. M. Steenvoorden, P. G. Kistemaker and A. E. DeVries, "Laser Single Photon Ionization Mass Spectrometry of Linear, Branched and Cyclic Hexanes", *Int. J. of Mass Spectrometry Ion Processes,* 107, 475-489 (1991).

R. K. Yoo, B. Ruscic, and J. Berkowitz, "Photoionization of $As_2$ and $As_4$: Implications for group V clusters", *J. Chem. Phys.,* vol. 96, No. 9, 1 May 1992, pp. 6696-6709.

*Primary Examiner*—Bruce C. Anderson
*Attorney, Agent, or Firm*—Greenlee & Winner

[57] ABSTRACT

The present invention provides a photoionization mass spectroscopy flux monitor for gaseous species above a sample surface. It provides an in situ, real time, species specific, nonintrusive probe with a geometry compatible with conventional MBE growth chambers. Gaseous species are photoionized above a sample surface and the ionized gaseous species are extracted parallel to the sample surface and coupled into a mass spectrometer inlet adjacent to the sample surface. The geometry of the flux monitor allows for simultaneous coupling of a charged particle beam with the sample surface, for example for monitoring film growth with RHEED.

28 Claims, 10 Drawing Sheets

PHOTOIONIZATION MASS SPECTROSCOPY FLUX MONITOR

This application is a continuation-in-part of application Ser. No. 07/950,602, filed Sep. 24, 1992 abandoned.

FIELD OF THE INVENTION

This invention pertains to flux monitoring of chemical species by photoionization mass spectroscopy and in particular to molecular beam epitaxy with simultaneous flux monitoring and reflection high energy electron diffraction monitoring.

BACKGROUND OF THE INVENTION

A major problem in the manufacture of semiconductor materials by molecular beam epitaxy (MBE) is the uncertainty in the exact composition and fluxes of constituents used to grow a successful crystal. Beam fluxes can be controlled by opening and closing mechanical shutters and by adjusting the temperatures of oven sources or by controlling the flow rate of metal organic vapor sources. However, direct monitoring of the gaseous species that actually impinge on the substrate, including impurities from cross-contamination between oven sources, is not readily possible. The ability to monitor, nonintrusively and directly in real time, the incoming and scattered chemical fluxes within a few millimeters of the substrate would result in greater control of the growth process, as well as increase reproducibility of material quality.

Methods currently available for monitoring MBE growth provide limited flux information. For example, quartz crystal microbalances and nude ionization gauges provide quantitative flux values but give no species specific information. An electron impact emission source provides quantitative, species specific measurements, but it is not easily applied to simultaneous monitoring of multiple species and does not measure the actual fluxes impinging on the substrate. Hollow cathode discharge lamps can be used to perform either emission or absorption spectroscopy on the chemical beams, but this technique is also hindered by difficulties when it is required to monitor multiple species simultaneously. Reflection mass spectroscopy (Tsao et al.(1989) Appl. Phys. Lett. 55:777) can also be used to monitor fluxes, but it has the drawback of not being able to monitor incoming fluxes to the substrate. The resultant measurements are also hindered by dissociation of detected species in the normal electron impact mass spectrometer ionizer, which complicates the interpretation of the signals.

The actual growth of the material can be monitored directly by such techniques as reflection high energy electron diffraction (RHEED). RHEED monitors the progress of the growth but does not give information regarding the density and composition of the impinging gaseous beams. A more ideal situation would be to have complementary, noninvasive methods to monitor multiple species quantitatively and in real time from the impinging chemical beams while simultaneously monitoring the growth on the substrate with techniques such as RHEED and ellipsometry. Tsao, supra, uses RHEED analysis simultaneously with reflection mass spectrometry.

Another category of relevant related art consists of studies utilizing photon ionization in conjunction with time-of-flight mass spectroscopy (TOF-MS). Single photon ionization (SPI) by 118 nm light, generated by frequency tripling the 355 nm frequency tripled output of a Nd:YAG laser, has been used to study organic molecules such as simple alkanes (Steenvoorden et al. (1991) Int. J. Mass Spectrom. Ion Processes 107:475), tripeptides (Becker et al. (1990) Int. J. Mass Spectrom. Ion Processes 95:R1), and various organic polymers (Pallix et al (1989) Anal. Chem. 61:805). Studies by Brum et al. (1990) Appl. Phys. Lett. 56:695 and Alford et al. (1991) J. Chem. Phys. 94:2618 used 193 nm light from an ArF excimer laser to detect trimethylaluminum and silicon clusters, respectively.

A patent by Becker et al. (1988) U.S. Pat. No. 4,733,073 describes a technique for analyzing solid samples using a desorption probe beam, nonresonant photoionization of desorbed material, and TOF-MS. In Becker's apparatus, the mass spectrometer inlet is positioned opposite the sample surface and ions are extracted perpendicular to the sample surface.

Chien and Sogard (1990) J. Vac. Sci. Technol. A 8:1597 describe a method using multiphoton ionization (MPI) and TOF-MS to measure beam flux in a MBE system. In their apparatus the direction of the molecular beam is perpendicular to both the laser beam and the axis of the mass spectrometer. They demonstrate monitoring of molecular beam fluxes but do not insert a sample substrate in their apparatus.

SUMMARY OF THE INVENTION

The present invention provides a photoionization mass spectroscopy flux monitor for gaseous species above a sample surface. It provides an in situ, real time, species specific, nonintrusive probe with a geometry compatible with conventional MBE growth chambers. In addition, the geometry of the flux monitor allows for simultaneous coupling of a charged particle beam with the sample surface, for example for monitoring film growth with RHEED.

In the flux monitor of the present invention, gaseous species are photoionized above a sample surface and the ionized gaseous species are extracted parallel to the sample surface and coupled into a mass spectrometer inlet adjacent to the sample surface. This permits unobstructed access to the sample surface, example by for molecular, photon, electron, or ion beams.

An electrostatic extraction network produces an electric field approximately parallel to the sample surface. To permit measurement within a few millimeters of the sample surface, the sample and its holder are introduced into the extraction region. The extraction region is designed to compensate for the deformations in the electric field introduced by the sample. This can be accomplished with appropriately biased conductive elements within the extraction region. The electrostatic extraction network can utilize gridded plates to pass ions to the mass spectrometer and, in the case of non-normal incidence beam fluxes, to pass molecular beams to the sample.

The photoionization can be single photon ionization, for example at 118 nm with the ninth harmonic of a Nd:YAG laser, or multiphoton ionization, for example with an excimer laser or with the third or fourth harmonic of a Nd:YAG laser at 355 or 266 nm, respectively. Single photon ionization reduces the amount of molecular fragmentation compared to MPI. Production of 118 nm light is accomplished by focusing the 355 nm frequency tripled output of a pulsed Nd:YAG laser into a Xe cell or a Xe/Ar cell.

Mass spectrometric analysis of the ionized species can be performed by a time-of-flight mass spectrometer or by a quadrupole mass spectrometer. TOF-MS analysis provides simultaneous species specific monitoring of one or more ionized gaseous species.

The flux monitor of this invention can monitor an incoming flux of gaseous species, a reflected flux, or a flux of material removed from a sample surface by, for example, ion beam bombardment or temperature programmed desorption. Extraction of the ionized species parallel to the surface permits noninvasive monitoring of gaseous species impinging on the sample surface. The incoming and reflected flux can be distinguished in the case of non-normal beam incidence by the dependence of the measured flux on the position of the photoionizing beam, and in general by removing the sample and thereby eliminating the reflected flux.

In the flux monitor of this invention the sample surface can be held near ground potential, thereby allowing a charged particle beam to propagate above and impinge on the sample surface. An aspect of this invention is the measurement of chemical flux with simultaneous coupling of a charged particle beam with the sample surface, for example for RHEED analysis of the sample. In the flux monitor of this invention, the extraction electric field deflects the diffraction pattern on the RHEED phosphor screen, but with minimum distortion. This deflection of the RHEED pattern permits the photoionization beam inlet to be situated opposite the electron beam inlet and adjacent to the RHEED phosphor screen.

A further aspect of this invention is the apparatus for providing access to an interaction region within a chamber to two approximately counter-propagating beams, one of which is a charged particle beam. In this apparatus the two beams have inlets opposite each other and an electric field deflects the charged particle beam away from the inlet of the second beam. This can be utilized to permit analysis of the charged particle beam without blocking the second beam and it can be utilized to protect the second inlet from bombardment by the charged particle beam. In one embodiment of this apparatus, the charged particle beam is a RHEED electron beam and the second beam is a photoionization beam, as used in the flux monitor described above.

A further aspect of this invention is a source of arsenic atoms usable in MBE. To produce As atoms, arsenic dimers or tetramers are incident on a silicon surface heated to above about 1000K.

BRIEF DESCRIPTION OF THE DRAWINGS

FIG. 3 shows calculated equipotentials for an extraction region with a uniform field (FIG. 3a), a field perturbed by a sample and its holder (FIG. 3b), and a field with an electrostatic extraction network which compensates for the perturbation by the sample and its holder (FIG. 3c).

FIG. 4 shows TOF mass spectra of a molecular beam produced by an arsenic oven.

DETAILED DESCRIPTION OF THE PREFERRED EMBODIMENT

Referring now to the drawings, like numbers indicate like elements and the same number appearing in more than one drawing refers to the same element.

Figure 1:
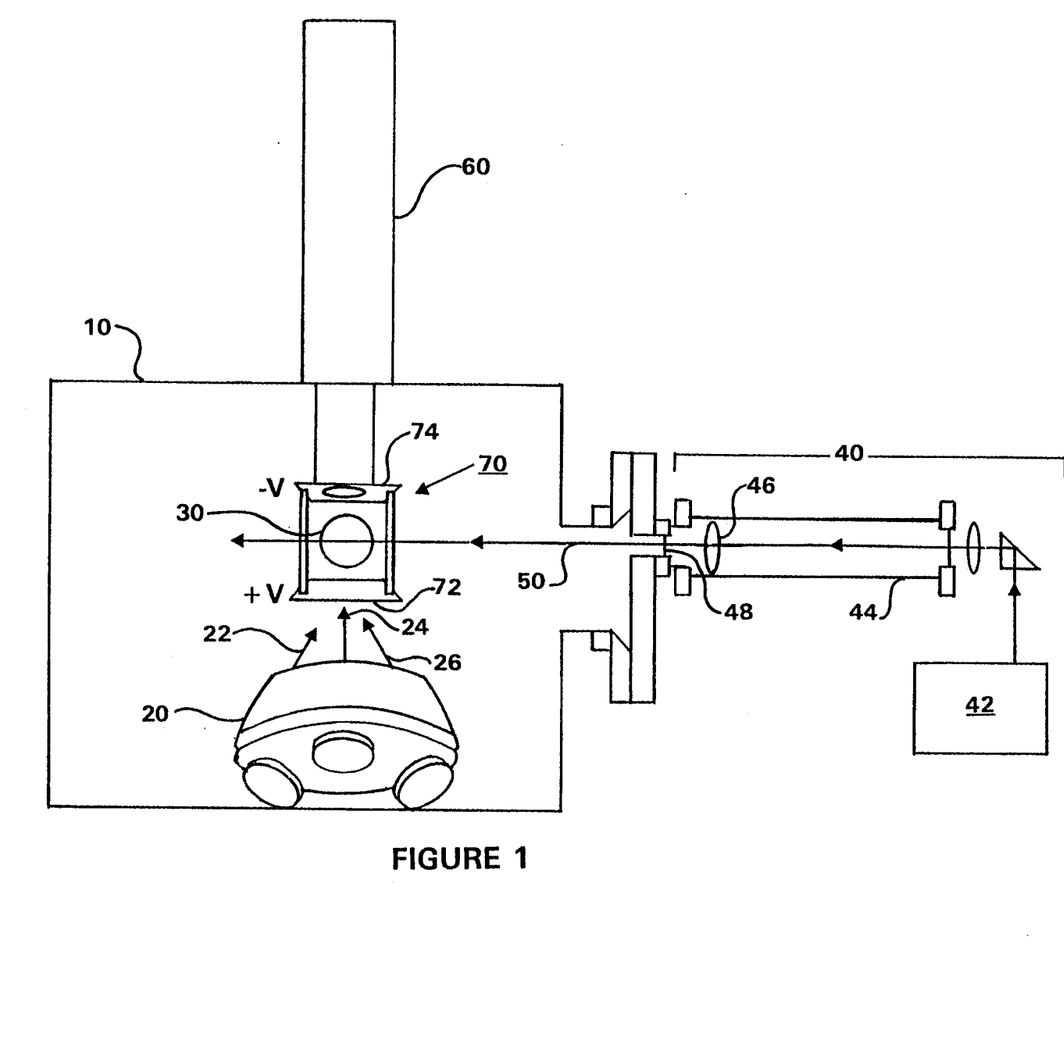
FIG. 1 is a photoionization mass spectrometer flux monitor within an MBE deposition system.

FIG. 1 is an embodiment of the flux monitor of the present invention. The flux monitor comprises laser means 40 for producing photoionizing beam 50, electrostatic ion extraction network 70 and mass spectrometer 60. In this embodiment, the flux monitor is housed in vacuum chamber 10. The flux of molecular beams 22, 24 and 26 can be monitored simultaneously near the surface of sample 30. The term molecular beam is used herein to refer to both atomic and molecular beams. Molecular beam source 20 is mounted opposite sample 30, i.e. the beam source is approximately centered on the line normal to and intersecting the center of the sample surface. In the drawing the beam source is shown off center so that the underlying elements can be seen. In this embodiment the axes of the molecular beams, the photoionizing beam, and the mass spectrometer are approximately mutually orthogonal.

The term approximate is used herein to describe functional, rather than mathematically precise, positioning or qualities. All geometric descriptions herein are approximate. The functional criteria of the apparatus positioning follow. Beam source 20 is mounted opposite sample 30 to provide the molecular beams access to the sample surface. Electrostatic network comprising charged plates 72 and 74, extracts ions parallel to the sample surface so that the mass spectrometer does not block the molecular beam access to the surface. This permits continuous monitoring without interrupting beam flow. Photoionizing beam 50 is parallel to the sample surface and is orthogonal to the direction of ion extraction so that it is not obstructed by the extraction network or the mass spectrometer. Variations in the positioning of the elements of the flux monitor which meet these criteria are within the scope of the present invention.

In the embodiment of FIG. 1, photoionizing beam 50 comprises 118 nm photons. Production of 118 nm light is accomplished, as is known in the art (Kung et al. (1973) Appl. Phys. Lett. 22:301), by focussing the 355 nm frequency tripled output of pulsed Nd:YAG laser 42 into frequency tripling Xe gas cell 44. Ultraviolet transparent lens 46 collimates the 118 nm light, which propagates through UV transparent window 48 directly into the vacuum chamber and into the extraction region of the mass spectrometer while the 355 nm light is diffused. A more specific way to separate the 355 nm light is through the use of prism optics.

The 118 nm light provides single photon ionization of the molecular beam. Multiphoton ionization can also be employed in the flux monitor of this invention. SPI reduces the amount of molecular fragmentation compared to MPI. Essentially, the energy is sufficiently large to ionize, but not large enough to ionize and fragment. In the case of MBE probing, the ability to avoid dissociation of molecules such as $As_4$ or $As_2$ greatly simplifies interpretation of mass spectra. Furthermore, most species, both. molecular and atomic, which are relevant to III–V and II–VI MBE have ionization potentials less than the ninth harmonic (118 nm, 10.5 eV) of the Nd:YAG laser (Rosenstock et al. (1977) J. Phys. Chem. Ref. Data 6, Supp. 1 and Yoo et al. (1992) J. Chem. Phys. 96:6696), making their detection by SPI possible. SPI can also be accomplished with the frequency tripled output of a frequency doubled dye laser. For species with structured absorption spectra, this provides the ability to tune to an absorption resonance.

Molecular beam source 20 can comprise oven sources as are known in the art. It can comprise a single beam source or a plurality of sources, as illustrated. When more than one oven is employed, the beams cannot all be orthogonal to the sample surface. Instead they converge on the sample at angles typically up to 45° from normal. The ovens can further include oven-crackers as is known in the art, for example to convert $As_4$ to $As_2$. Beam source 20 can also comprise metal organic sources such as pressurized cylinders of metal organic species coupled with mass flow controllers. Molecular beam species with which the flux monitor of the present invention can be used include, but are not limited to, atomic and molecular members of groups II, III, IV, V, and VI of the periodic table and molecular compounds containing these species. The electronic output of the flux monitor can be used as feedback information to control the fluxes of MBE chemical beams at their respective sources.

In the embodiment shown in FIG. 1, the flux monitor of the present invention can monitor the flux of incoming molecular beam species. It can also monitor species reflected from the sample surface. When the beam impinges at non-normal incidence, the incoming and reflected beams can be distinguished above the sample surface by probing in different locations. Alternatively, to probe only the incoming beam the sample can be removed, thereby eliminating the reflected beam. The flux monitor can also be used to monitor material removed from a sample surface. In this case, a probe beam such as an ion beam, electron beam or photon beam impinges on the surface and removes material from the sample. The material can also be thermally removed, for example by temperature programmed desorption (Carleton et al. (1987) J. Vac. Sci. Technol. B 5:1141).

The access to the sample surface provided by the geometry of the extraction network of the present invention can be utilized not only for molecular beams but for photon or particle processing beams as well. For example, in photochemical vapor deposition the process gas can flow across the sample surface and a photolysis source can be positioned opposite the sample surface in the position of beam source 20 in FIG. 1. Similarly, for photon, electron or ion beam processing (for example for microchip fabrication), the process gases, if any, can flow across the sample surface and the photon, electron or ion beam can be positioned opposite the sample surface. The unobstructed access to the sample surface permits steering of the process beam for pattern generation. The flux monitor can analyze the composition of either process gasses or material removed from the sample surface. In the case where gasses flow across the sample surface, upstream and downstream fluxes can be monitored by appropriate positioning of the photoionizing beam.

Figure 2:
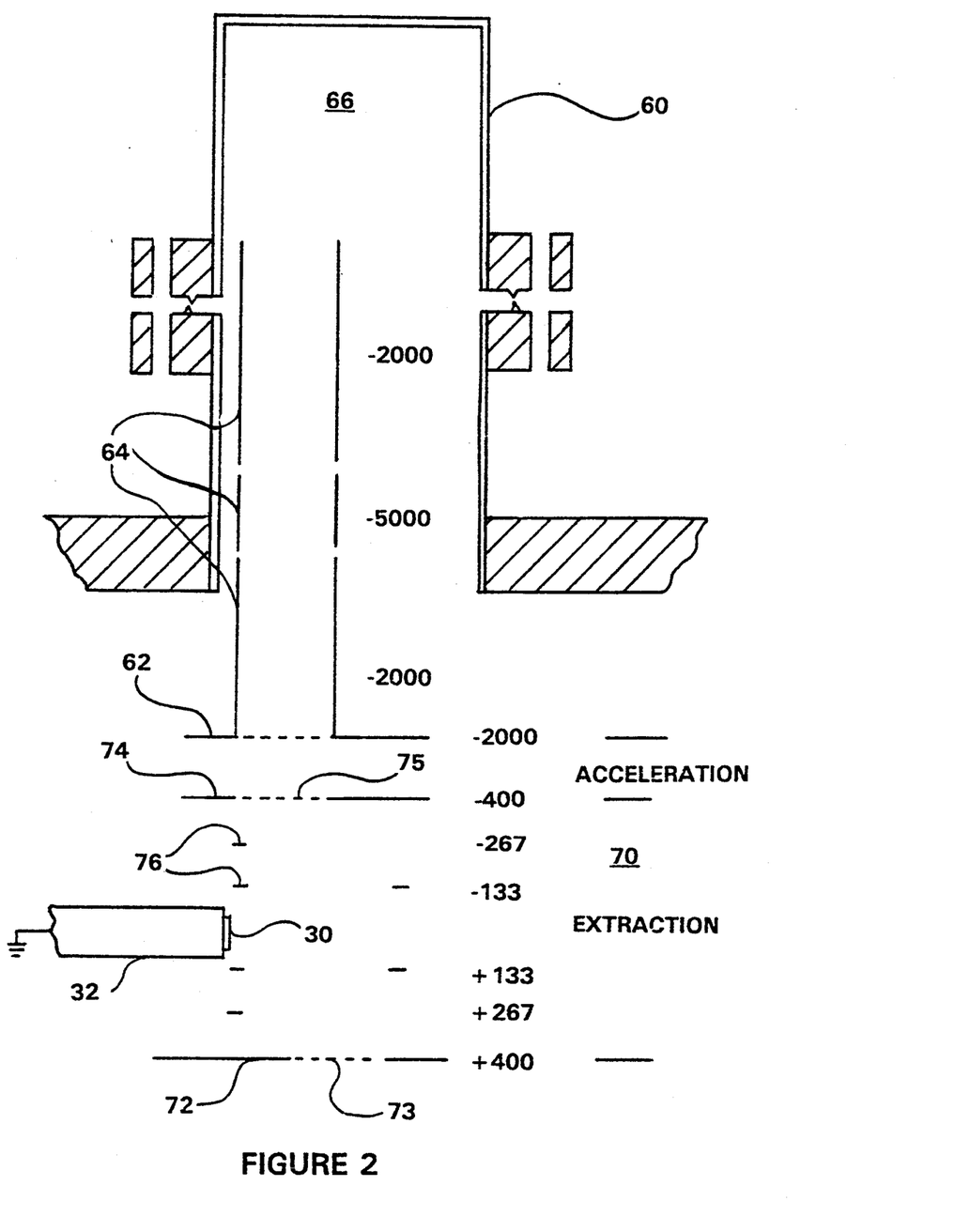
FIG. 2 is an electrostatic extraction network of a flux monitor.

Mass spectral analysis can be performed by a TOF mass spectrometer, as is known in the art (Wiley et al. (1955) Rev. Sci. Inst. 26 1150). In the flux monitor of this invention, the extraction region permits detection of chemical fluxes proximate to a sample surface. FIG. 2 illustrates an embodiment of the extraction region of this invention. Sample 30 is mounted on heatable sample holder 32 proximate to or within extraction region 70. The extraction region is formed by an electrostatic network comprising plates 72 and 74 and a plurality of additional plates 76. In the embodiment of FIG. 2 there are six additional plates. Plates 72 and 74 contain gridded regions 73 and 75. The plates can be mounted with insulating rods, as shown in FIG. 1. Extracted ions are accelerated into mass spectrometer 60 by acceleration plate 62 and focused by electrostatic lens 64 onto ion detector 66.

Figure 3A:
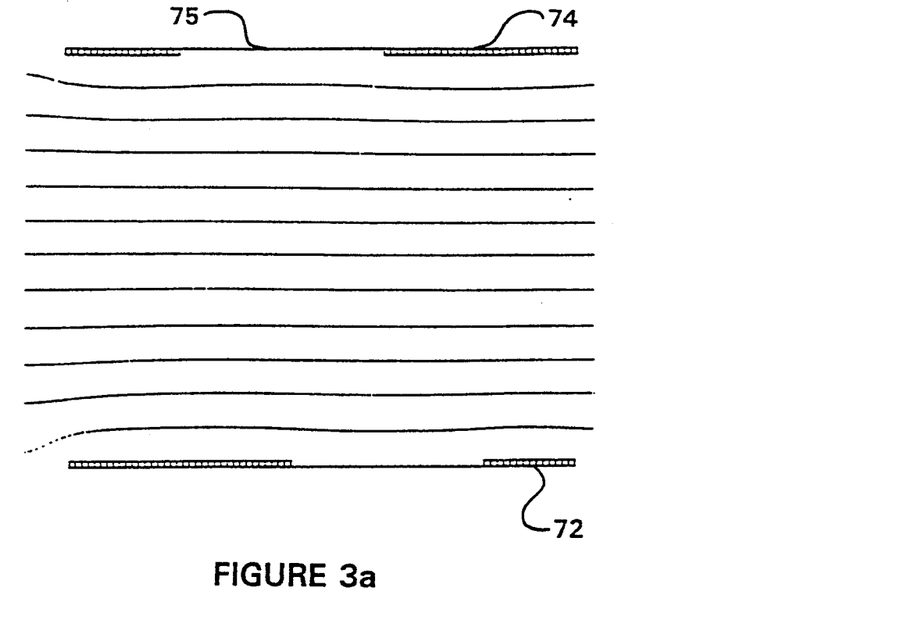
Figure 3B:
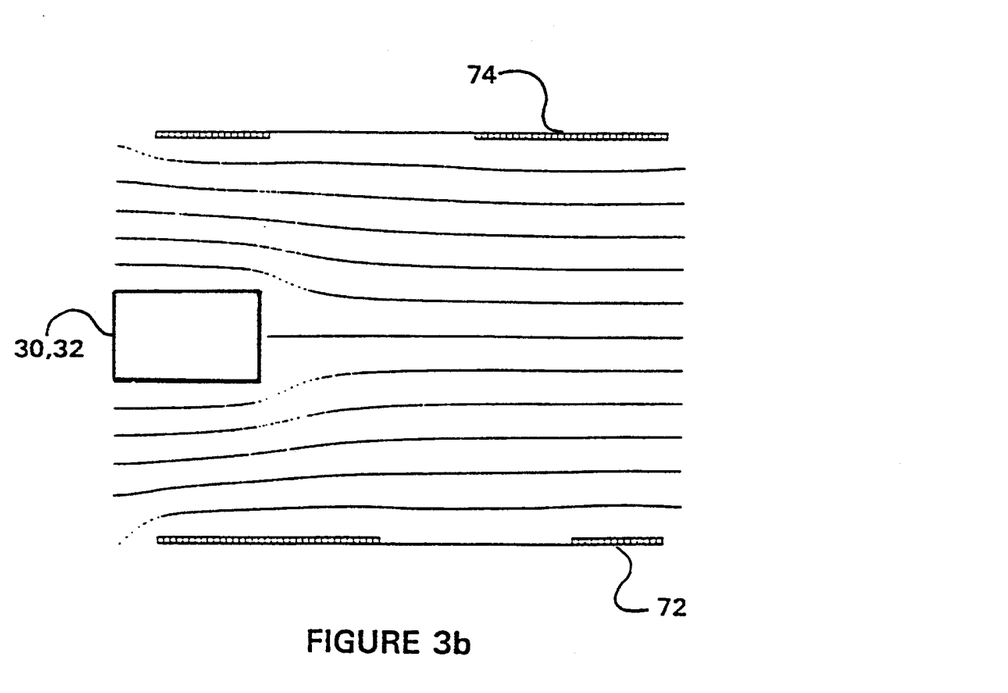

The electric field equipotential planes of the extraction region of the mass spectrometer are illustrated in FIG. 3. The equipotentials are numerically calculated assuming infinite extension of the plates into and out of the page. In its simplest configuration (FIG. 3a) this extraction network is plates 72 and 74 with grid 75 to pass ions to the mass spectrometer. In this configuration the ions are accelerated only perpendicular to the plates. When chemical fluxes are probed near a sample surface, the sample 30 and its holder 32 must be introduced into the extraction region. FIG. 3b shows the influence this has on the equipotentials. The equipotentials now deviate from ideal uniform planes. The deformations introduce components, of acceleration parallel to the plates. Because of these components, ions may be deflected from the central axis of the extraction region and never be detected.

Figure 3C:
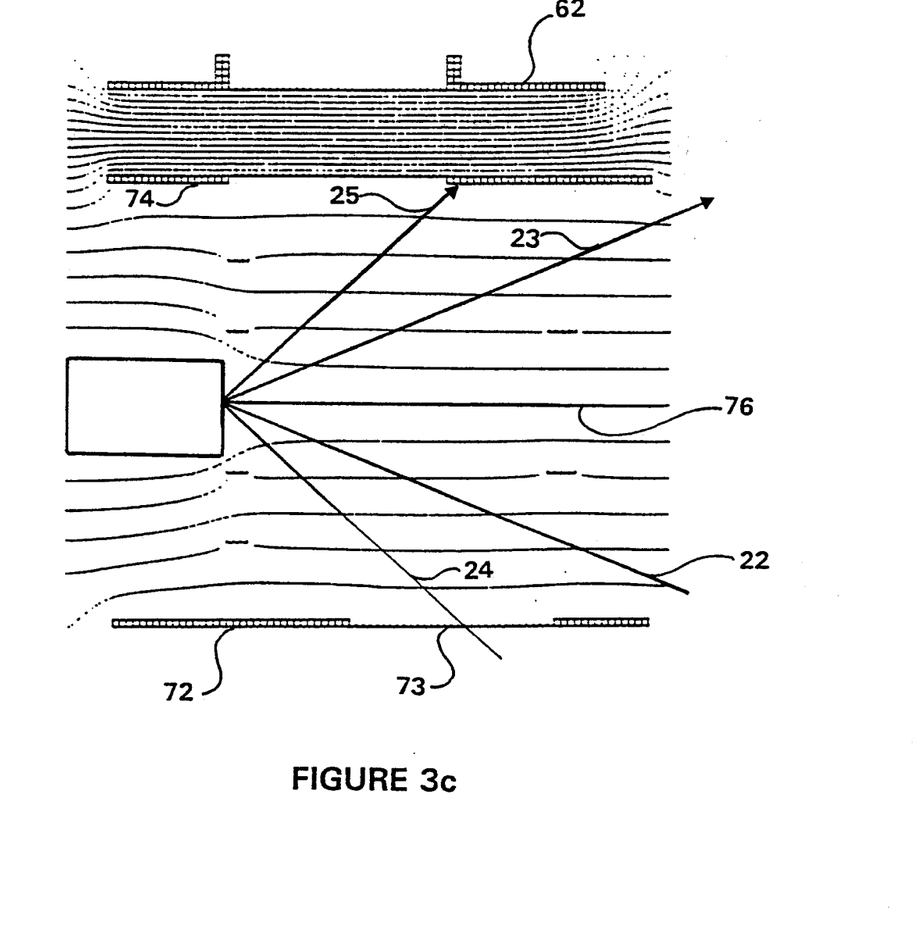

To compensate for the deformations in equipotentials introduced by placing the sample into the extraction region, the electrostatic network of this embodiment comprises more than the minimum two plates. FIG. 3c exemplifies an extraction region comprising 6 additional plates 76. The extra plates, known as guard plates, are spaced through the extraction region such that the potential on each plate matches the potential that would be present at that position if no substrate were present, as indicated in FIG. 2. In this way deformations are reduced. The sample is near ground potential, as opposed to a typical TOF-MS where the sample or the extraction region is held at a high positive potential. The term "approximately uniform electric field" is used herein for a field of sufficient uniformity to extract ions into the mass spectrometer in spite of the effect of the sample holder. The region proximate to the sample surface is defined hereby as the region in which perturbations of the electric field caused by insertion of the sample into the extraction region are corrected by the extraction network, thereby permitting ions in this region to be extracted and detected by the mass spectrometer as opposed to being deflected from the mass spectrometer. The smallest distance from the sample surface which can be monitored depends on the design of the electrostatic network. In the embodiment of FIG. 2 species within a few millimeters can be monitored.

Grid 75 passes ions to the mass spectrometer. The extraction region of this invention can include additional grid 73 on plate 72 to pass one or more incoming molecular beams 24, as illustrated in FIG. 3c. This provides access to the sample surface to a multiplicity of molecular beams and to beams which are at an angle to the surface normal. The beams passing through the grid suffer the greatest possibility for unwanted scattering, first because of the grid itself, and second because the beam 25 scattered specularly from the sample surface strikes plate 74. Thus species such as Ga and In which stick readily to surfaces and therefore do not undergo scattering are preferred for beam 24. Species such as arsenic dimers and tetramers which scatter readily can instead be directed in beam 22 between guard plates such that even specular beam 23 can exit without striking a plate. The grids can be any open or partially open region of the plates which permits gas flow but does not significantly perturb the electric field.

A further advantage of the extraction region of this invention is that electron beam heating of the substrate from the rear can be performed. The negative voltage on plate 74 repels stray electrons from the mass spectrometer. To do electron beam heating it may be advantageous to hold the substrate at a nonzero potential and to fix the electrostatic network potentials with reference to the substrate potential.

The extraction network illustrated in FIGS. 2 and 3c exemplifies but does not limit the present invention. The specific voltages indicated are tailored to a specific vacuum chamber and sample holder. They can be modified to provide a uniform extraction field for other experimental conditions. Indeed, the field need not actually be uniform to accomplish the coupling of ions into the mass spectrometer. It can, for example, contain a non-uniform field region which compensates for the field perturbation proximate to the sample holder. It can also include a field which provides electrostatic focussing. The use of curved plates for elements 72 and 74 could allow ion extraction without additional plates 76. In lieu of static electric fields, the voltages on the electrostatic network can be temporally dynamic such as pulsed fields which can be employed, for example, to study species in front of the sample surface as a function of delay time following the photoionization pulse. The voltages on the members of the electrostatic network can be pulsed non-synchronously, which may, for example, offer advantages in focussing the ions into the mass spectrometer. Other networks which minimize or compensate for the distortion introduced by the proximity of the sample to the extraction region will be readily apparent to those skilled in the art and are within the scope of this invention.

Figure 4A:
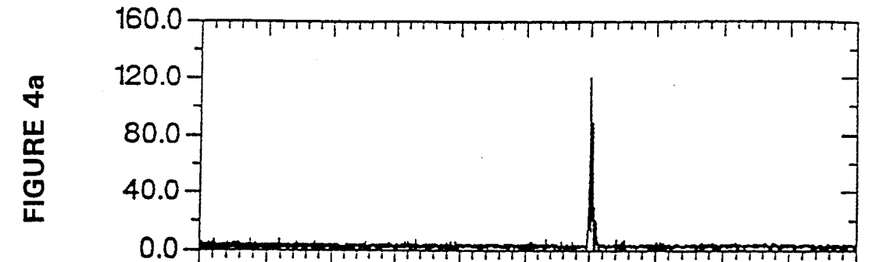
FIG. 4a is the signal acquired by a single pulse at 118 nm probing a pure $As_4$ beam.
Figure 4B:
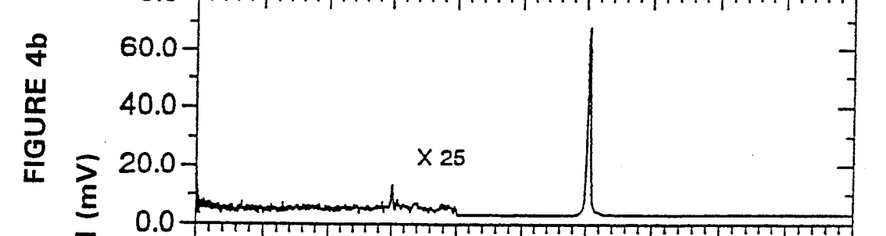
FIG. 4b is the signal acquired as in FIG. 4a summed over 3000 laser pulses.
Figure 4C:
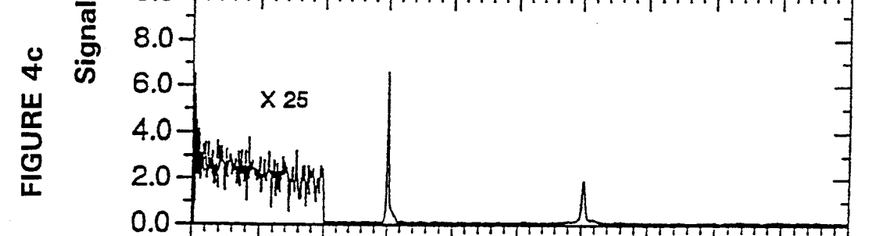
FIG. 4c is the signal with a cracker stage to produce $As_2$ by thermal dissociation of $As_4$.
Figure 6:
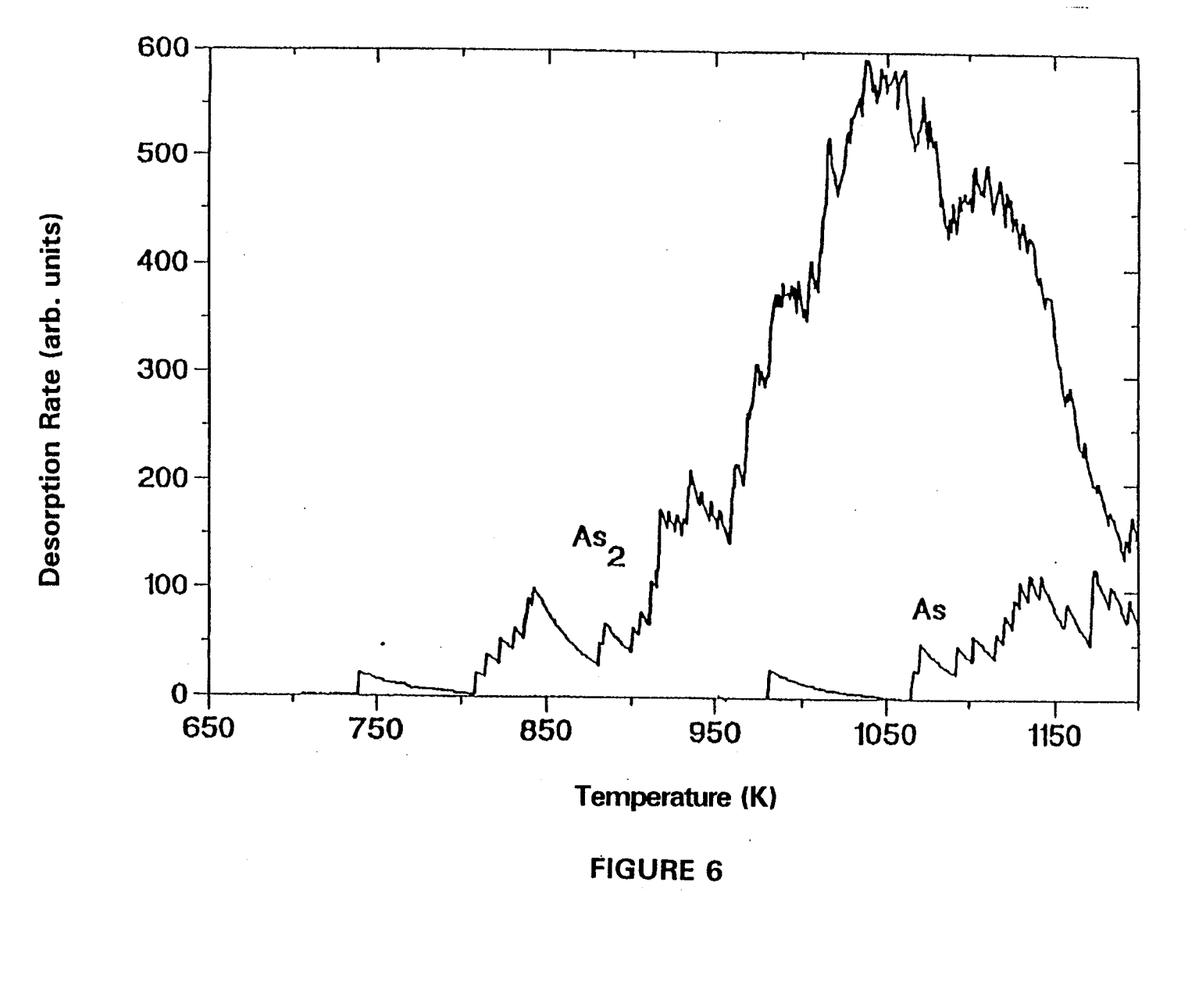
FIG. 6 shows the flux of $As_2$ and As removed by temperature programmed desorption of one monolayer of arsenic on Si(100).
Figure 7:
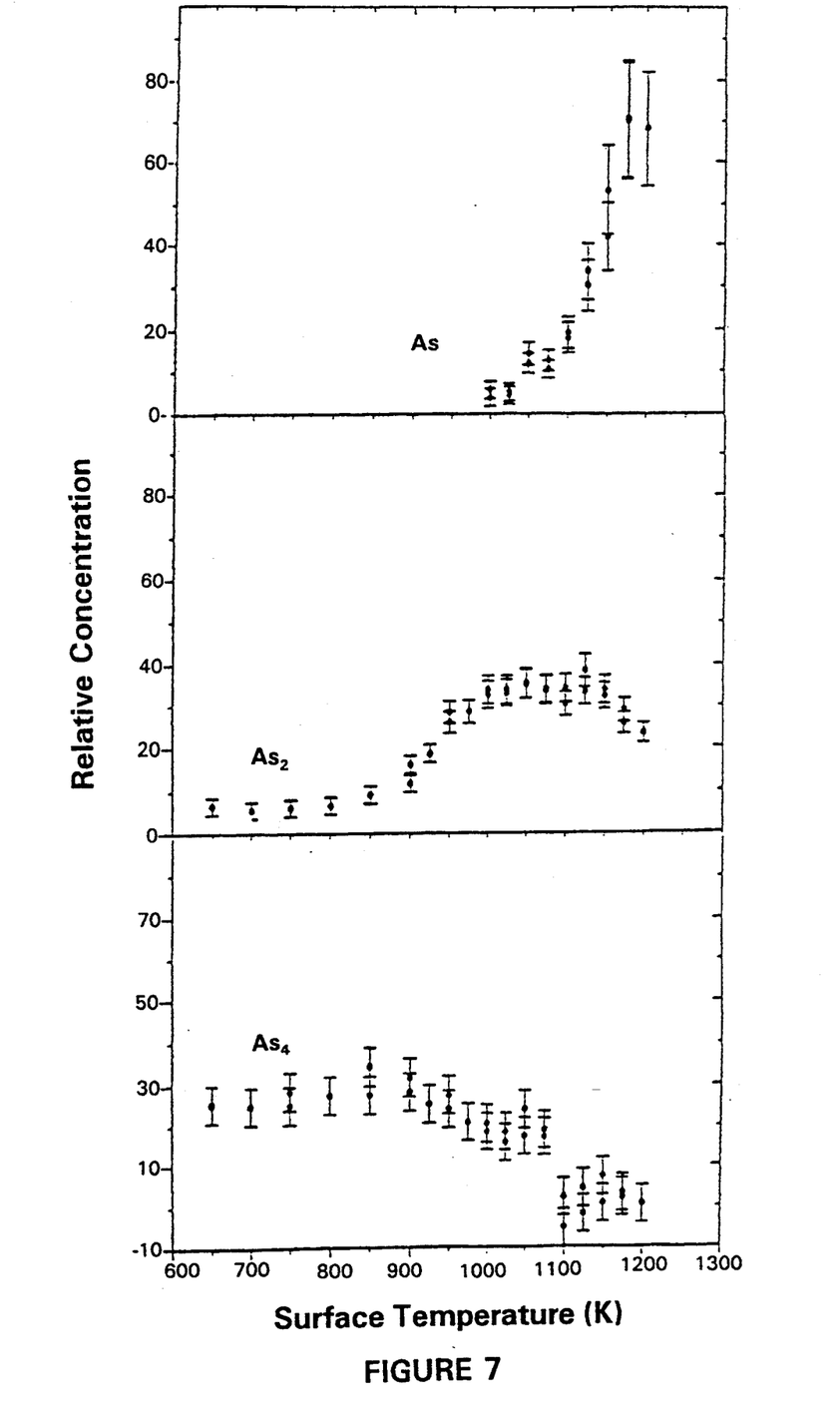
FIG. 7 shows steady state concentrations of scattered and dissociated arsenic species from Si(100) as a function of surface temperature for a continuous incident $As_4$ flux.

The use of the embodiment of the flux monitor shown in FIGS. 1 and 2 in an MBE system is illustrated for incoming beams (FIGS. 4 and 5), for material removed from the surface (FIG. 6) and for reflected beams (FIG. 7). FIG. 4 shows TOF mass spectra of the molecular beam produced by the arsenic source. FIG. 4a is a sample signal acquired by a single 118nm laser pulse generated with 10 mJ of 355 nm light and used to probe a beam of pure $As_4$ at 300 u (u=atomic mass unit). The source includes an arsenic cracker stage which, in this instance, is set at a low temperature to avoid production of $As_2$. The $As_4$ flux in the beam is on the order of $10^{14}$ molecules $cm^{-2}s^{-1}$. Good signal to noise is observed even for single pulses although the pulse-to-pulse signal variation is approximately ±50%. This variation could be due to the pulse-to-pulse variation in the third order process generating the 118 nm light. FIG. 4b is acquired under the same conditions as FIG. 4a, however the signal is a summed average of 3000 laser pulses. When the signal level in FIG. 4b is enlarged by a factor of 25, a small amount of mass 150 ($As_2^+$) is observed. The signal from $As_2^+$ corresponds to 0.4% of the $As_4^+$ signal. At the oven temperature of 700 K, less than $10^{-6}$ of the arsenic vapor is $As_2$ (Hultgren et al. (1973) "Selected Values of the Thermodynamic Properties of the Elements", American Society for Metals, Metals Park, Ohio), suggesting that the $As_2^+$ results from a laser induced process. At this laser power, signal levels of mass 225 ($As_3^+$) and mass 75 ($As^+$) are less than 0.1% (noise level) of the $As_4^+$ signal FIG. 4c shows a TOF-MS of the arsenic beam with the cracker stage turned up to a high enough temperature to produce $As_2$ by thermal dissociation. At mass 75, less than 0 5% (noise level) of the $As_2^+$ signal level is observed, indicating that $As_2^+$ does not dissociate to $As^+$ as a result of ionization at 118 nm.

Figure 4D:
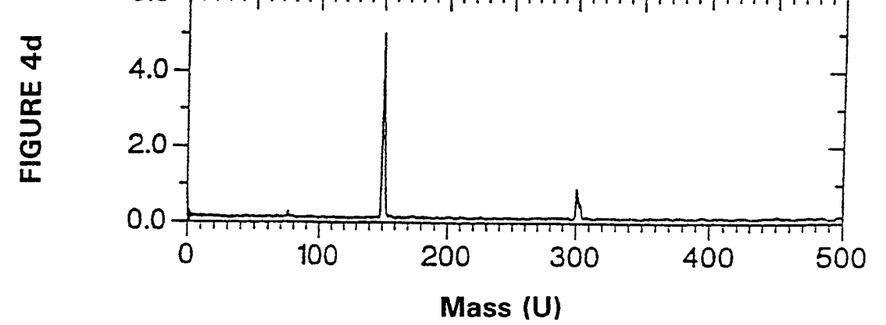
FIG. 4d is the signal acquired with MPI at 266 nm probing a pure $As_4$ beam.

Fragmentation of the parent ion is often more extensive when lower energy photons are used for ionization. In order to drive the multiphoton ionization process, high power densities are necessary, which can result in multiple absorptions and fragmentations. FIG. 4d shows a mass spectrum collected when probing a beam of pure $As_4$ with 266 nm photons rather than 118 nm photons. At 266 nm (4.67 eV, fourth harmonic of Nd:YAG), ionization of $As_4$ is at least a 2 photon process. Using 3 mJ of laser energy at 266 nm, the minimum laser energy necessary to achieve signal levels comparable to those at 118 nm, extensive fragmentation of $As_4^+$ occurs, as shown in FIG. 4d. Fragmentation of the parent ion greatly complicates interpretation of the mass spectrum, especially if $As_2$ and As also exist in the probe region and need to be detected. The use of the single photon method avoids ambiguities in interpretation of the mass spectrum.

Quantitative flux measurements require calibration of the flux monitor. Absolute ionization cross sections can be used for calibration. Relative calibrations can also be obtained. For example, by comparing the ion signal levels at a constant arsenic oven temperature before and after turning up the cracker stage, the relative ionization probability of $As_4$ versus $As_2$ at 118 nm can be determined. Two $As_2$ molecules result from the dissociation of each $As_4$ molecule. If the ionization probability, collection efficiency of the TOF-MS, and molecular beam geometry of $As_4$ and $As_2$ are the same for both species, then the $As_2^+$ signal should increase by twice the amount that the $As_4^+$ signal decreases. Immediately prior to increasing the cracker temperature to collect the data in FIG. 4c, the $As_4^+$ signal height was 19.0 mV. Approximating the TOF efficiency and beam geometries as equal for the two species, and comparing the relative changes in peak areas before and after turning up the cracker, indicates that the relative ionization probability of $As_4/As_2$ is approximately 7:1. These are measurements of density and not flux, so applying a <1/velocity> correction based on the mass and oven/cracker temperature, the relative ionization probability of $As_4/As_2$ is approximately 4:1. Even without such calibration, the flux monitor of this invention can be utilized, for example, to improve process uniformity and reproducibility.

Figure 5:
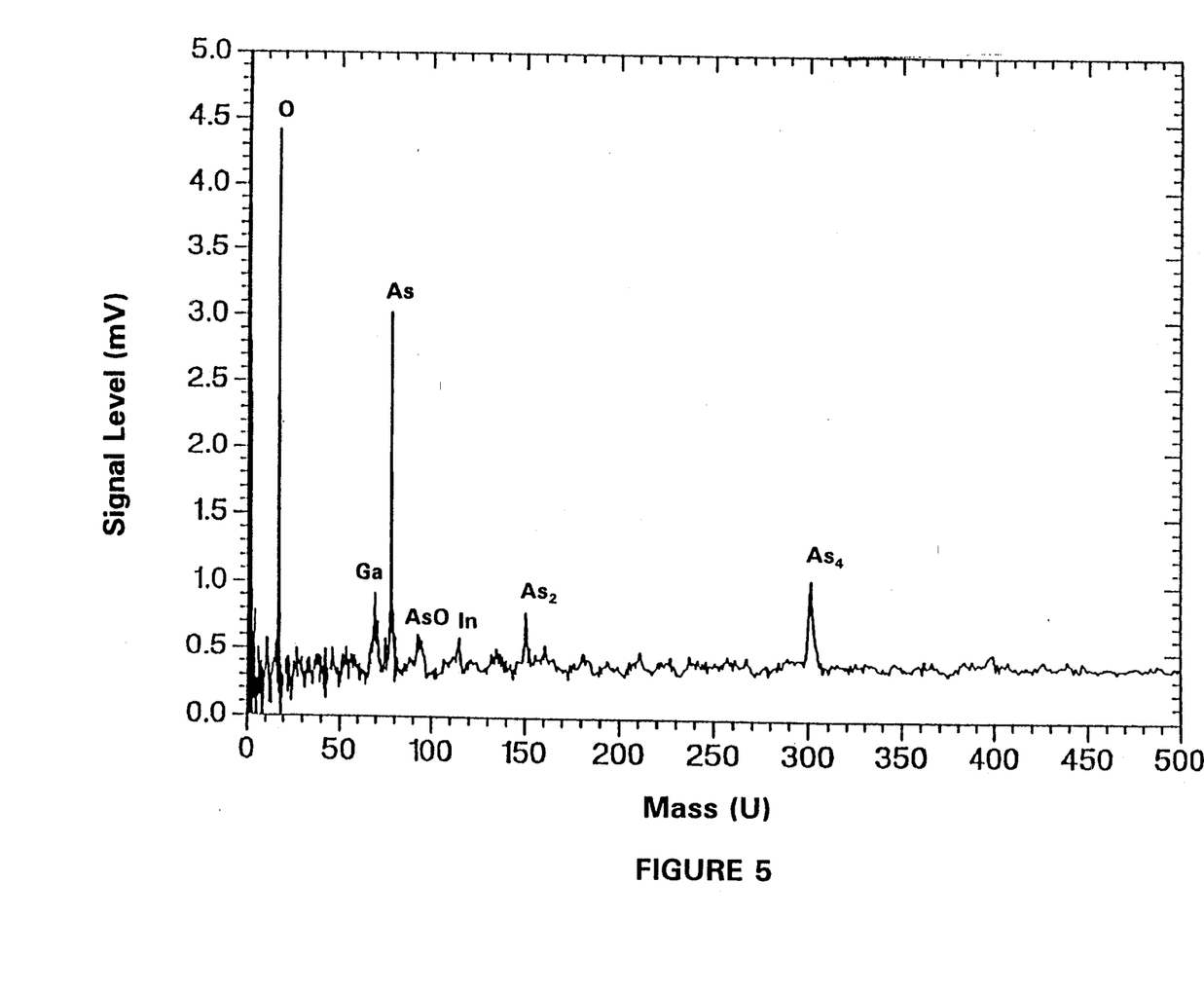
FIG. 5 is the mass spectrum resulting from a summation average of 1000 laser pulses at 118 nm probing a Ga beam source.

The flux monitor of this invention was used to probe the flux produced by a conventional Ga oven. The results show an important effect of cross contamination. FIG. 5 shows a mass spectrum resulting from a summation average of 1000 laser pulses. Signals corresponding to $O^+$ (16 u), $^{69}Ga^+$ (69 u), $^{71}Ga^+$ (71 u), $As^+$ (75 u), $AsO^+$ (91 u), $In^+$ (115 u), $As_2^+$ (150 u), and $As_4^+$ (300 u) are observed. The $Ga^+$ signal, however, is very weak. The other species detected are contaminants in the beam arising from cross-contamination from the arsenic source and traces of In which remained in the Ga oven from previous use as an In source. The level of $As_2^+$ detected is much greater than the 0.4% contribution known to occur from $As_4^+$ dissociation and implies that $As_2$ is present or that $As_2^+$ is a fragment of another arsenic containing molecule. Since neither $As_4$ nor $As_2$ dissociate to $As^+$ at 118 nm, the presence of $As^+$, $O^+$, and $AsO^+$ suggests that arsenic oxides or other molecules may be present, which dissociate to atomic species. Ga is the most abundant species in the beam, yet its signal level at 118 nm is less than that observed for other species which are present even at contaminant levels. Nonetheless, in spite of the relatively low ionization probability of Ga at 118 nm, this species is still detectable by the flux monitor of this invention.

The flux monitor of this invention has also been employed to monitor material removed from a sample surface. One monolayer of arsenic on a Si(100) surface was prepared by depositing arsenic from an $As_4$ beam on a room temperature sample and heating the sample to 600K. Temperature programmed desorption measurements of desorbing As and $As_2$ are illustrated in FIG. 6. One monolayer of arsenic was desorbed from Si(100) with a heating rate of 10 K $s^{-1}$. $As_2$ begins to desorb at ~800K and peaks around 1025K. Arsenic atoms are desorbed at temperatures above 1000K. $As_4$ is not detected as a desorption product from one monolayer or less. The $As^+$ signal in FIG. 6 is due to direct atom desorption and not from the dissociation of vibrationally excited $As_2$ or $As_2^+$. This is verified using the flux monitor to monitor $As_2$ produced in the arsenic cracker source with vibrational temperatures ranging from 800K to greater than 1200 K. No atoms are produced. The relative ionization probability of $As_2$ to As at 118 nm was found to be 3:1 by comparison of the integrated signal area of the measured flux from flash desorption at 1150 and 1000K.

The flux scattered from a sample surface has also been monitored with the flux monitor of this invention. Species scattered from Si(100) under a continuous state exposure to $As_4$ ($\sim 10^{14}$ molec $cm^{-2} s^{-1}$) are shown in FIG. 7. The $As_4$ beam passes through the extraction region and intersects the silicon substrate at 22° below the surface normal. The surface temperature is varied from 650 to 1200K. Additional measurements are made with the substrate removed, and the background signal from the incident flux alone is subtracted from the total signal due to both incident and scattered flux. FIG. 7 is a plot of the relative gas phase concentrations of scattered and dissociated $As_4$, $As_2$, and As as a function of surface temperature. The data points are the result of sum averages of 2000 laser pulses. The plotted ion signal levels are corrected by the $<1/\text{velocity}>$ factor and by the relative sensitivity factors between $As_4:As_2:As$ which are determined to be 12:3:1. The dissociation of $As_4$ to $As_2$ and As depends strongly on temperature.

Atom production is substantial at temperatures greater than 1100K. Previous studies have assumed that dimers are the exclusive desorption product for arsenic from silicon. The observation of desorption of As atoms from a high temperature silicon surface is a new result which illustrates the utility of the flux monitor of this invention. This result reveals the utility of heated silicon to produce As atoms from arsenic compounds such as arsenic dimers and tetramers. An embodiment of this invention is the combination of an oven producing $As_4$ with a stage comprising silicon heated above about 1000K. The As atom source can be utilized, for example, in molecular beam epitaxy. In the present art, overpressures of $As_2$ or $As_4$ are employed because of the low sticking coefficients of the dimer and tetramer. Thus an As atom source, as described above, is a significant improvement.

Figure 8:
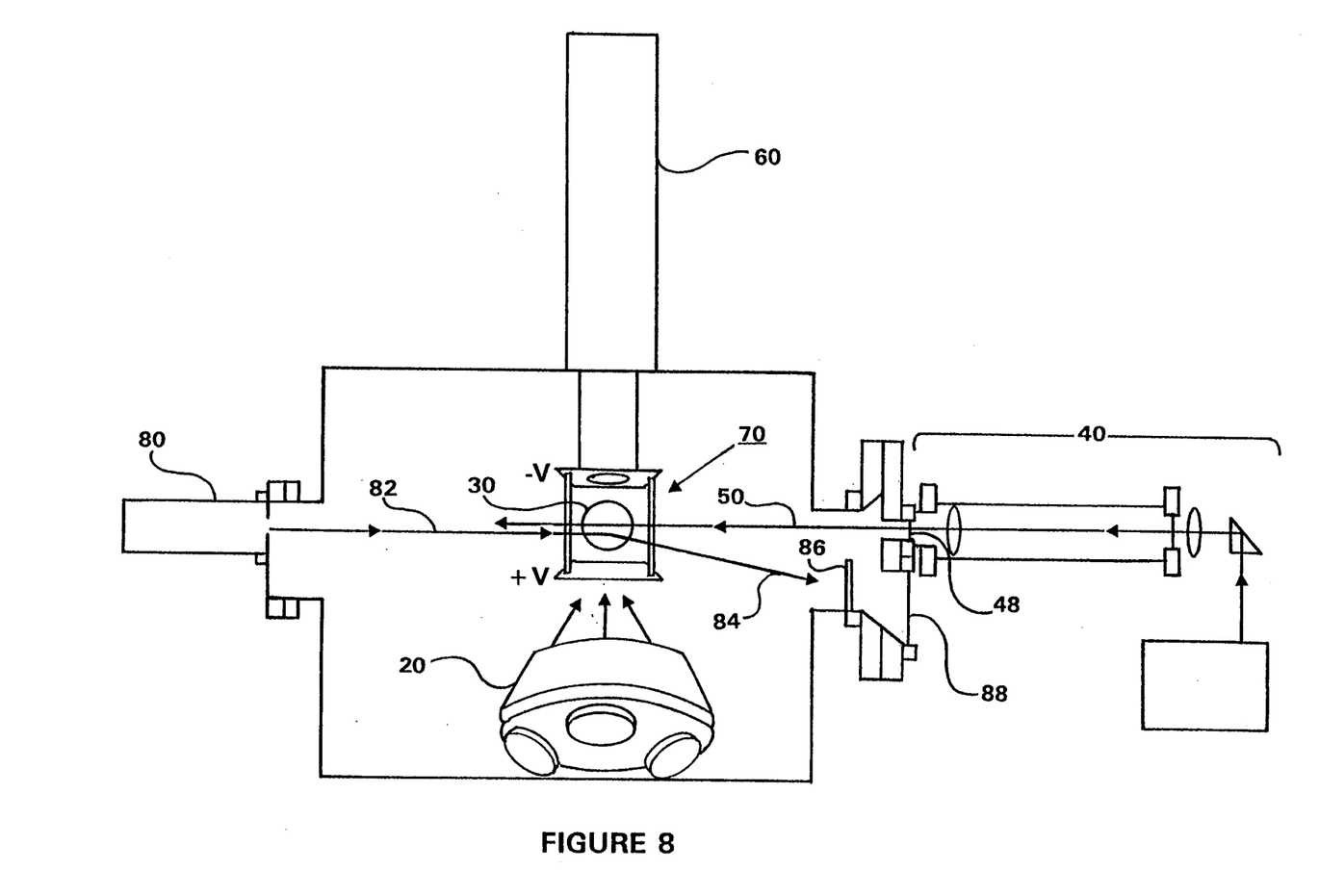
FIG. 8 shows the simultaneous use of RHEED and photoionization mass spectrometer flux monitoring in a MBE deposition system.

The geometry of the flux monitor of the present invention further permits simultaneous access to the sample for a processing or analysis beam which is approximately counter-propagating to the photoionizing beam. FIG. 8 illustrates an embodiment with simultaneous flux monitoring and RHEED analysis during MBE. RHEED electron gun 80 is positioned approximately opposite photon source 40 and electron beam 82 propagates approximately counter to photon beam 50. Beam 82 impinges on sample 30 at a glancing angle, for example 4°, and diffracted beam 84 impinges on RHEED phosphor screen 86. The RHEED pattern is viewed through viewport In this embodiment, the voltages applied to extraction region 70 are such that a ground plane exists at the sample. This electrical configuration makes it possible for the electron beam to impinge on the sample. Alternatively, the sample and the RHEED electron gun can float at a common potential. The electric field of the extraction region deflects the RHEED diffraction pattern as illustrated in FIG. 8. This permits entry of the photoionizing beam approximately opposite the electron beam inlet. RHEED viewport 88 can be an inexpensive viewport such as pyrex and the photon beam can be introduced through a separate, smaller, UV transparent window 48 such as LiF, thus reducing window cost. Because deflection of the electron beam permits mounting the RHEED viewport and the photon inlet on a single flange, simultaneous flux monitoring and RHEED analysis can be more easily and inexpensively implemented. In particular this facilitates adding the flux monitor of the present invention onto existing MBE systems.

Figure 9:
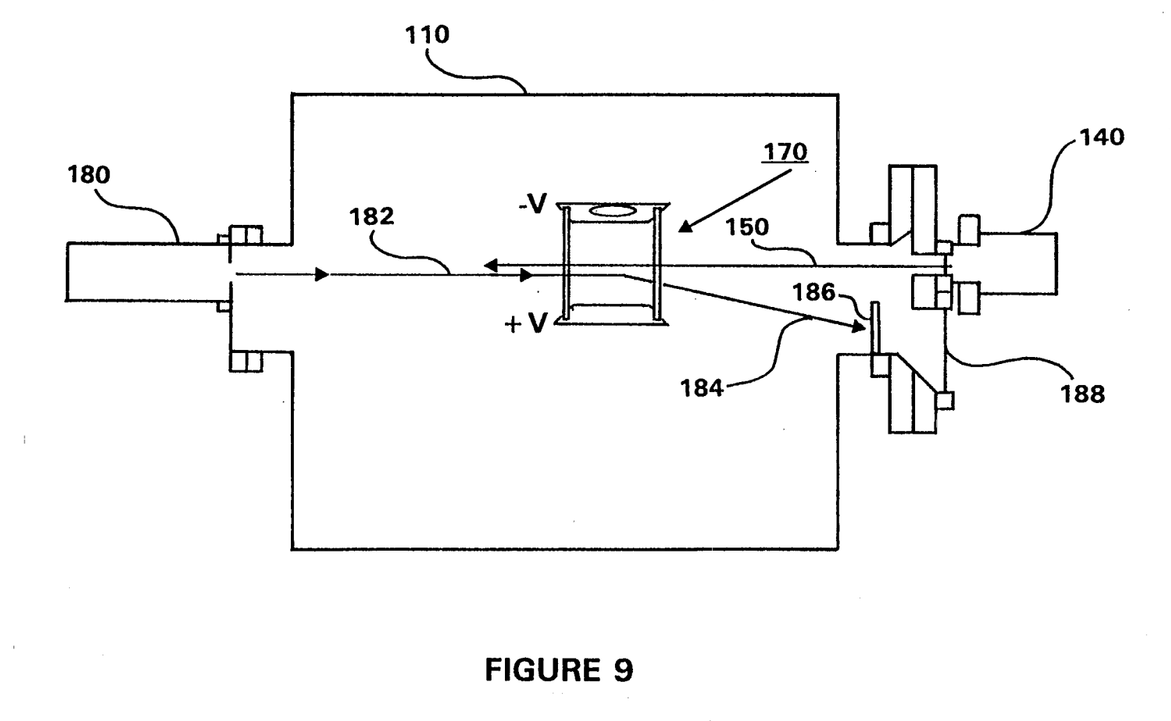
FIG. 9 is an apparatus for providing access to an interaction region to two approximately counter-propagating beam sources, one of which is a charged particle beam.

A further aspect of this invention is the deflection of a charged particle beam in order to provide access to an interaction region to two approximately counter-propagating beams, one of which is a charged particle beam, as illustrated in FIG. 9. Charged particle beam source 180 introduces charged particle beam 182 into chamber 180. Electrostatic network 170 deflects the charged particle beam 184 towards position 186. Beam source 140, located approximately opposite source 180, introduces beam 150 which propagates approximately counter to beam 182. Beam 182 is a charged particle beam such as an electron or ion beam. Beam 150 can be any beam such as a molecular, photon, electron, or ion beam. When beam 150 is a charged particle beam it is deflected by the field as well. The deflection of charged particle beam 182 can serve to protect the inlet of the second beam. It can also serve to permit analysis of the charged particle beam, for example with a RHEED phosphor screen at position 186 and viewport 188. An advantage provided by the apparatus of this invention is the ability to mount more than one element on a single flange and the ability to mount the two beam inlets on opposing flanges. This embodiment demonstrates the application of this apparatus for RHEED analysis. Other applications will be readily apparent to those skilled in the art.

This invention provides a photoionization mass spectroscopy flux monitor. An electrostatic network extracts ions parallel to the sample surface, thus providing unobstructed access to the sample surface. The electrostatic network is designed to provide a uniform electric field proximate to the sample surface. In an exemplified embodiment, the monitor is used for MBE deposition with simultaneous RHEED analysis. The access to the sample surface provided herein can also be utilized for photon, ion, or electron beam processing. Fluxes of incoming or reflected beams can be monitored as well as chemical species removed from the sample thermally or with a probe beam. These and other variations of the utilization and design of the flux monitor are within the spirit and scope of this invention.

We claim:

1. A flux monitor for detecting gaseous species in front of a sample surface comprising:
   photoionizing means for ionizing said gaseous species;
   a mass spectrometer for analyzing the ionized gaseous species; and
   extraction means for extracting said ionized gaseous species in a direction approximately parallel to said sample surface, and for coupling said ionized gaseous species with said mass spectrometer, said extraction means capable of extracting ions proximate to said sample surface.

2. The flux monitor of claim 1 wherein said extraction means comprises an electrostatic extraction network for producing an extraction region with an electric field.

3. The flux monitor of claim 2 wherein said electric field is approximately uniform.

4. The flux monitor of claim 2 wherein said electric field focusses said ionized gaseous species into said mass spectrometer.

5. The flux monitor of claim 2 wherein said electric field is temporally dynamic.

6. The flux monitor of claim 2 wherein said electrostatic extraction network comprises an electrically biased element with an opening therein for transmitting said ionized gaseous species from said extraction region to said mass spectrometer.

7. The flux monitor of claim 6 wherein said electrostatic extraction network comprises a second electrically biased element with an opening therein for transmitting an incoming beam of gaseous species from a beam source to said sample surface.

8. The flux monitor of claim 2 wherein said electrostatic extraction network includes more than two electrically biased elements.

9. The flux monitor of claim 8 wherein the applied electrical potential difference between a first of said biased elements and a second of said biased elements, divided by the applied electrical potential difference between said first of said biased elements and a third of said biased elements, is equal to the distance between said first of said biased elements and said second of said biased elements, divided by the distance between said first of said biased elements and said third of said biased elements.

10. The flux monitor of claim 1 wherein said sample surface is near ground electrical potential.

11. The flux monitor of claim 1 wherein said photoionizing means comprises single photon photoionizing means.

12. The flux monitor of claim 11 wherein said single photon photoionizing means includes means for tuning the wavelength of said photon.

13. The flux monitor of claim 1 wherein said potoionizing means comprises multiple photon photoionizing means.

14. The flux monitor of claim 1 wherein said mass spectrometer means comprises a time-of-flight mass spectrometer.

15. The flux monitor of claim 1 wherein said flux comprises one or more incoming molecular beams impinging on said sample surface.

16. The flux monitor of claim 15 wherein said flux comprises two or more incoming molecular beams impinging on said sample surface.

17. The flux monitor of claim 15 wherein said photoionizing means comprises single photon photoionizing means and wherein said mass spectrometer comprises a time-of-flight mass spectrometer.

18. The flux monitor of claim 17 wherein said single photon photoionizing means comprises a Nd:YAG laser, a first frequency tripling means for frequency tripling said laser, and a second frequency tripling means for frequency tripling the frequency tripled laser beam, thereby producing the ninth harmonic of the Nd:YAG laser beam.

19. The flux monitor of claim 1 wherein said flux comprises gaseous species scattered from said sample surface.

20. The flux monitor of claim 1 wherein said flux comprises gaseous species removed from said sample surface.

21. The flux monitor of claim 1 wherein said photoionizing means further includes optical means for selecting the region in which said gaseous species are ionized.

22. The flux monitor of claim 1 further including feedback means electronically coupled with said mass spectrometer and with the source of said gaseous species, for electronically controlling the source of the flux to maintain the flux of said gaseous species at a preselected level in response to the detected amount of said gaseous species.

23. The flux monitor of claim 1 further including means for RHEED analysis of said sample surface.

24. The flux monitor of claim 23 wherein said sample surface and the source of RHEED electrons are at approximately the same electrical potential.

25. The flux monitor of claim 23 wherein said means for RHEED analysis comprises a phosphor screen for receiving the RHEED electron beam following diffraction by said sample surface and means for detecting the diffraction pattern on said screen.

26. The flux monitor of claim 25 wherein the photons produced by said photoionizing means propagate adjacent to an edge of said phosphor screen.

27. The flux monitor of claim 25 wherein said means for RHEED analysis further includes an electron beam producing means.

28. A method of monitoring the flux of gaseous species above sample surface comprising the steps of:

photoionizing said gaseous species;
extracting the ionized gaseous species, including the ionized gaseous species proximate to said sample surface, in a direction approximately parallel to said sample surface;

coupling said ionized gaseous species into a mass spectrometer; and
analyzing said ionized gaseous species with said mass spectrometer.

* * * * *